(12) United States Patent
Moscatelli et al.

(10) Patent No.: US 7,005,336 B2
(45) Date of Patent: Feb. 28, 2006

(54) PROCESS FOR FORMING CMOS TRANSISTORS AND MOS TRANSISTORS OF THE DRAIN EXTENSION TYPE, WITH A LOW GATE REGION RESISTANCE, IN THE SAME SEMICONDUCTOR SUBSTRATE

(75) Inventors: Alessandro Moscatelli, Como (IT); Claudia Raffaglio, Milan (IT); Alessandra Merlini, Nova Milanese (IT); M. Paola Galbiati, Monza (IT)

(73) Assignee: STMicroelectronics S.r.l., (IT)

( * ) Notice: Subject to any disclaimer, the term of this patent is extended or adjusted under 35 U.S.C. 154(b) by 0 days.

(21) Appl. No.: 10/746,881

(22) Filed: Dec. 23, 2003

(65) Prior Publication Data
US 2004/0229438 A1 Nov. 18, 2004

(30) Foreign Application Priority Data
Dec. 30, 2002 (EP) .................... 02425807

(51) Int. Cl.
H01L 21/8238 (2006.01)
H01L 21/461 (2006.01)
H01L 21/302 (2006.01)

(52) U.S. Cl. .................. 438/199; 438/210; 438/719
(58) Field of Classification Search .............. 438/199, 438/210, 719, 724, 742, 754, 756
See application file for complete search history.

(56) References Cited

U.S. PATENT DOCUMENTS

| | | | | |
|---|---|---|---|---|
| 5,030,585 A | * | 7/1991 | Gonzalez et al. | 438/210 |
| 5,672,898 A | * | 9/1997 | Keller et al. | 257/383 |
| 6,559,059 B1 | * | 5/2003 | Chien et al. | 438/719 |
| 6,822,261 B1 | * | 11/2004 | Yamazaki et al. | 257/59 |
| 2002/0084492 A1 | | 7/2002 | Osanai et al. | |
| 2003/0127689 A1 | * | 7/2003 | Hebert | 257/336 |
| 2005/0051815 A1 | * | 3/2005 | Snyder | 257/288 |

OTHER PUBLICATIONS

Tsui, et al., "Integration of Power LDMOS into a Low-Voltage 0.5 um BiCMOS Technology", Electron Devices Meeting, Technical Digest, International San Francisco, CA, Dec. 13-16, 1992, IEEE, US, pps. 27-30; XP010106441; ISBN: 0-7803-081704.
European Search Report, EP 02425807, dated Oct. 9, 2003.

* cited by examiner

Primary Examiner—Michael Lebentritt
Assistant Examiner—Walter L. Lindsay, Jr.
(74) Attorney, Agent, or Firm—Jenkens & Gilchrist, PC

(57) ABSTRACT

A process is disclosed for forming, on a common semiconductor substrate, CMOS transistors and vertical or lateral MOS transistors on at least first and second portions, respectively, of the substrate. A first dielectric layer is formed on the substrate. A first semiconductor material layer is then formed on the first dielectric layer, in the first portion. A stack structure comprising a second dielectric layer, second semiconductor layer, and low-resistance layer is then formed over the substrate. First ports are defined in the second semiconductor layer and the low-resistance layer to provide gate regions of the vertical or lateral MOS transistors. The second semiconductor layer and the low-resistance layer are then removed from the first portion of the substrate by using the second dielectric layer as a screen. Second ports in the second dielectric layer and the second semiconductor layer are then defined to provide gate regions for the CMOS transistors. The gate region of the vertical or lateral transistors is then covered with a protective layer. A low-resistance layer is then formed on the gate regions of the CMOS transistors.

23 Claims, 3 Drawing Sheets

PROCESS FOR FORMING CMOS TRANSISTORS AND MOS TRANSISTORS OF THE DRAIN EXTENSION TYPE, WITH A LOW GATE REGION RESISTANCE, IN THE SAME SEMICONDUCTOR SUBSTRATE

PRIORITY CLAIM

The present application claims priority from European Application for Patent No. 02425807.1 filed Dec. 30, 2002, the disclosure of which is hereby incorporated by reference.

BACKGROUND OF THE INVENTION

1. Technical Field of the Invention

The present invention relates to a process for forming, on a common semiconductor substrate, a number of components, among which include CMOS transistors, vertical or lateral drain-extension MOS transistors, and LDMOS (Lateral Double-diffused MOS) transistors, in particular by dedicated silicidation techniques.

Although not limited thereto, the invention relates, in particular, to a process for forming CMOS transistors by a self-aligned silicidation technique to form source and drain active areas and low-resistance polysilicon gate electrodes, and for forming drain-extension MOS transistors with a gate region which is silicided by means of a different technique. The following description will cover this field of application for convenience of explanation only.

2. Description of Related Art

As it is well known, high-efficiency power transistors integrated on a silicon substrate, e.g., drain-extension MOS transistors for radio frequency power applications, are widely employed in such portable devices as mobile phones.

For these devices to perform as expected with respect to RF and power, they must be formed with dedicated processes that are complicated.

With reference to FIG. 1, a conventional drain-extension MOS transistor 1 will now be described, comprising a substrate 1, e.g., of the P+ type, on which an epitaxial layer 2, of the same species as the substrate but less doped, is formed.

A sinker region 3, of the same species as the substrate 1 but more doped, is then formed in the substrate 1 and the epitaxial layer 2.

A first N+ surface region 4 is formed between the epitaxial layer 2 and the sinker region 3. A second N+ region 5 is formed in the substrate 1.

A third, lightly doped N– region 6 is formed between the first and second region. In particular, the third region 6 lies adjacent to the second region 5, but out of contact with the first region 4. The third, lightly doped N– region 6 provides the drift region for the drain-extension MOS transistor.

A gate electrode G is formed on the layer 2, between the first and third regions 4 and 6, the electrode G being isolated by means of an oxide layer 7. The gate electrode G comprises a polysilicon layer 8 overlain by a silicide layer 9.

Conventionally, the drain-extension MOS device is provided with contacts 10, 11 and 12 to drain, body and source regions, respectively. The source contact 12 may be either provided on the back side of the substrate 1, as shown in FIG. 1, or on the body contact 11.

Drain-extension MOS devices for RF applications further require a short gate electrode G but with low resistance, thus capped with a silicide layer 9, so that devices having a high cutoff frequency (Ft) can be obtained, which reach a high oscillation frequency (fmax). The drift region 6 of such transistors, being lightly doped, can sustain a high drain voltage in power applications.

The processing of such devices is not compatible with the processes for fabricating VLSI CMOS devices in which the self-aligned silicidation technique is extensively employed to form source and drain active areas and low-resistance polysilicon gate electrodes. High-density high-performance CMOS structures can be fabricated with this technique.

A prior method for integrating CMOS transistors and drain-extension MOS transistors on the same substrate comprises additional steps for forming the MOS devices. In particular, standard dielectrics are deposited and patterned to protect the drift region from the standard silicidation technique.

While being advantageous from several points of view, this prior method has a drawback in that it significantly increases the resistivity of the gate electrode by reason of the protective layers that overlie the gate electrode reducing the amount of area that has to be covered with a silicide layer.

The underlying technical problem of this invention is to provide a process for integrating CMOS and drain-extension MOS devices, having appropriate structural and functional features so as to optimize the performance of the individual devices, thereby overcoming the limitations of prior art devices.

SUMMARY OF THE INVENTION

The invention relates to a process for forming, on a common semiconductor substrate, CMOS transistors and drain-extension MOS transistors on at least first and second substrate portions, respectively, the process comprising the following steps:

in said first portion, forming at least one CMOS transistor having a first gate region projecting from the substrate, and having respective source and drain regions formed in the substrate, each one of them including a first, lightly doped portion adjacent to the gate region, and including a second, heavily doped portion within said first lightly doped portion; and in said second portion, forming at least one drain-extension MOS transistor having a gate region projecting from the substrate, a source region including a first, heavily doped portion aligned to said gate region, and a drain region formed in the substrate and comprising a first, lightly doped portion adjacent to the gate region, and a second, heavily doped portion within said first lightly doped portion.

The present invention presents a process which can be compatible with a standard VLSI CMOS process allowing to realize drain-extension MOS transistors having fully silicided gates and not silicided portions of adjacent lightly doped active regions. Advantageously, the regions that are not to be silicided are screened off by means of layers already provided in the standard process for making CMOS devices.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Referring to FIGS. 2 to 5, a first embodiment of the process for forming silicided CMOS transistors and MOS transistors on a common semiconductor substrate in accordance with this invention will now be described.

The processing steps described here below are not exhaustive of a complete process for fabricating integrated circuits. This invention can be practiced along with integrated circuit fabrication techniques conventionally employed, and only conventional process steps, necessary for the understanding of the invention will be described.

Perspective views of portions of an integrated circuit during its fabrication are not drawn to scale, but rather to emphasize major features of the invention.

Figure 1:
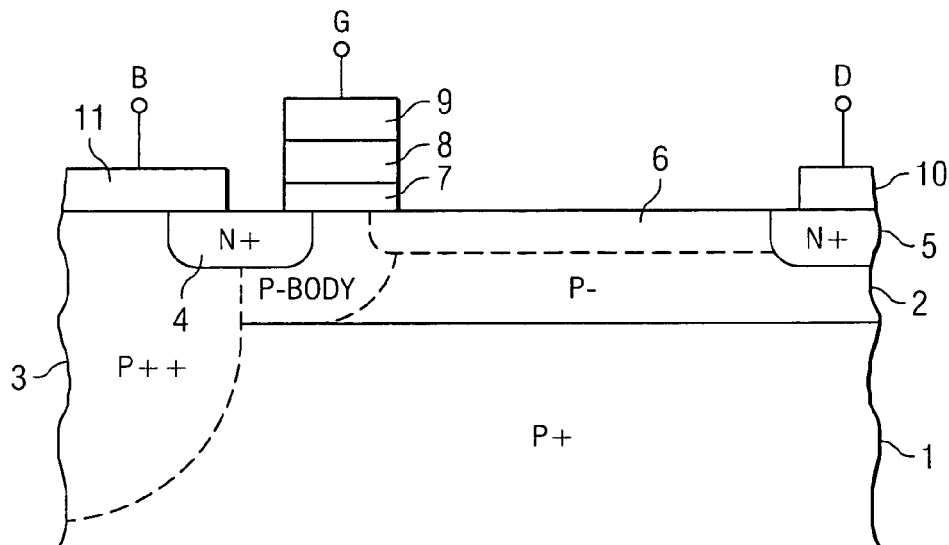
FIG. 1 is a sectional view of a drain-extension MOS transistor according to the prior art.
Figure 2:
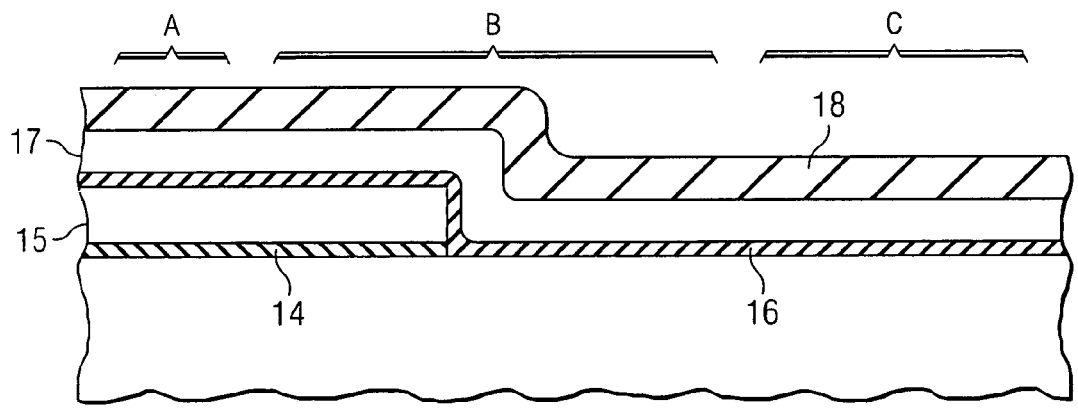
FIGS. 2–5 are sectional views, drawn to an enlarged scale, of a portion of a semiconductor substrate during fabrication steps according to a first embodiment of the inventive process.

In FIG. 2, a first dielectric layer 14 and first semiconductor material layer 15 are provided on a semiconductor substrate S which includes a first portion A where CMOS devices are to be formed, a second portion B providing separation, and a third portion C where drain-extension MOS devices are to be formed.

The first layer 14 is removed from the third portion C of the substrate 1 by a photolithographic operation followed by etching.

Advantageously, the first dielectric layer 14 is an oxide layer from which the gate oxide layer of the CMOS transistors is formed, and the first layer 15 of semiconductor material is a polysilicon layer from which the layer POLY1 of the CMOS transistors is formed.

There is then a cascade formation, on the whole device, of a stack structure comprising a second dielectric layer 16, e.g., silicon oxide, a second semiconductor material layer 17, e.g., polysilicon, and a low-resistivity layer 18, e.g., comprising tungsten.

Figure 3:
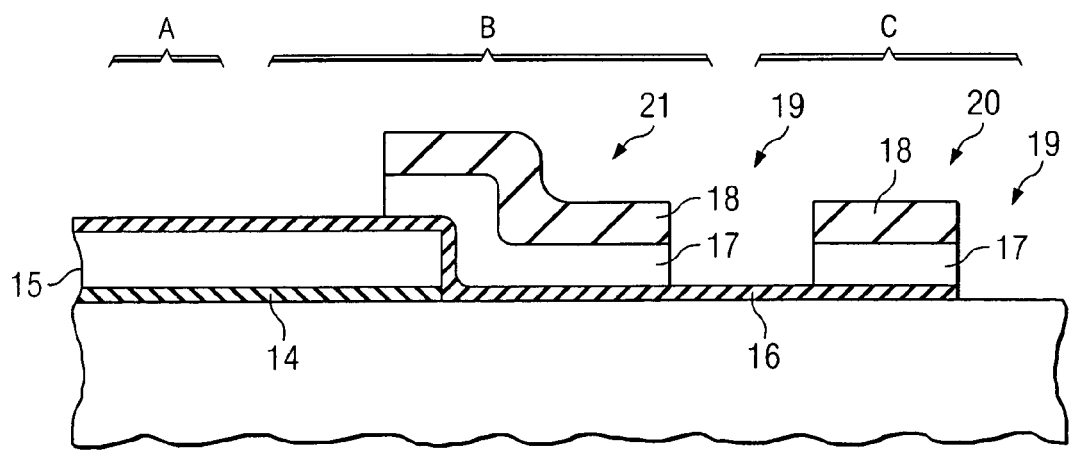

Turning next to FIG. 3, first openings 19 are provided in portion C, in both the semiconductor material layer 17 and low resistivity layer 18, to define a gate region 20 of the RF application devices.

The second semiconductor material layer 17 and low-resistivity layer 18 are removed from portion A completely.

Advantageously, the dielectric layer 16 formed on the first polysilicon layer 15 is utilized as a screen during removal of the second semiconductor material layer 17 in the portion C of the substrate 14.

Thus, a structure 21 is defined in portion B, which isolates the substrate portion A, where the CMOS devices are to be formed, from the substrate portion C where the RF application devices are to be formed.

Figure 4:
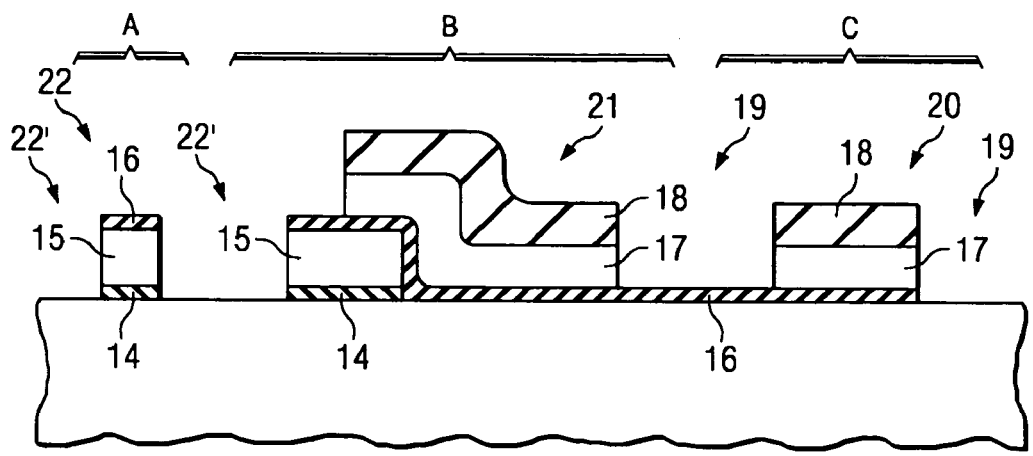

Through a conventional photolithography technique followed by etching, openings 22' are made to define gate regions 22 of the CMOS transistors in the portion A of the substrate 14, as shown in FIG. 4.

Figure 5:
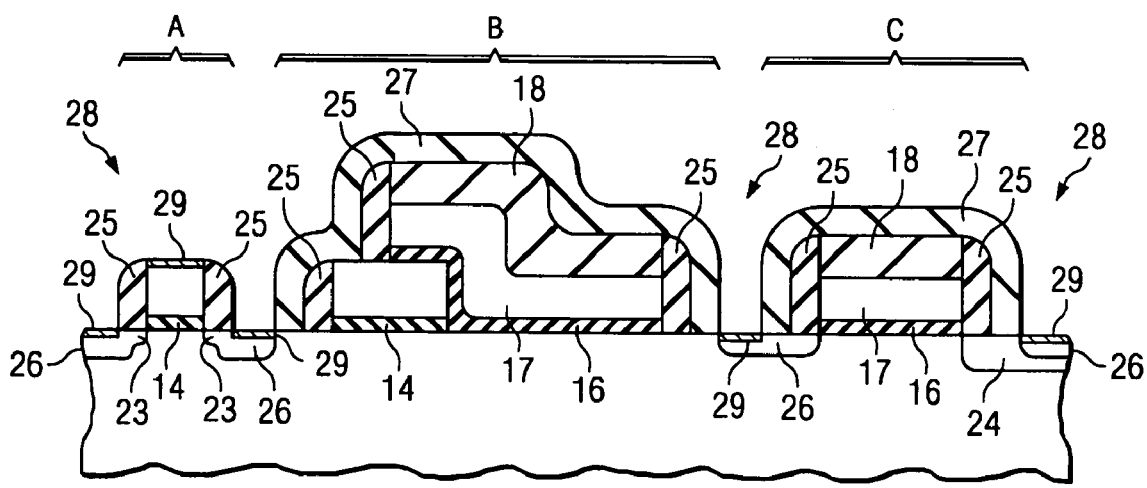

In FIG. 5, the substrate is then implanted with first LDD (Lightly Doped Drain) regions 23 to provide source and drain regions of the CMOS transistors.

Advantageously, drain regions 24 of the drain-extension MOS transistors are also formed during this process step.

In particular, the drain region 24 includes a lightly doped drift region adjacent to the gate region 20.

Conventional techniques are then applied to form spacers 25 on the sidewalls of the gate regions 20 of the RF devices, and on those of the division structure 21 and the gate regions 22 of the CMOS transistors.

Thereafter, second heavily doped implanted regions 26 are provided to complete the source and drain regions of the CMOS transistors, and the body and drain regions of the drain-extension MOS transistors.

A protective layer 27 is deposited onto the whole device. This protective layer 27 is removed from the substrate portion A completely to expose the substrate S. The protective layer 27 is provided with openings 28 in the body and drain regions of the drain-extension MOS transistor.

The protective layer 27 may be a dielectric layer.

A metal layer is formed on the whole device. This metal layer may be formed with a transition metal. The device is then subjected to a thermal process, so that the metal layer reacts with the substrate and layer 15 which is not covered by the protective layer 27 and forms a silicide layer 29.

A second embodiment of the process according to the invention will now be described with reference to FIGS. 6–9.

Figure 6:
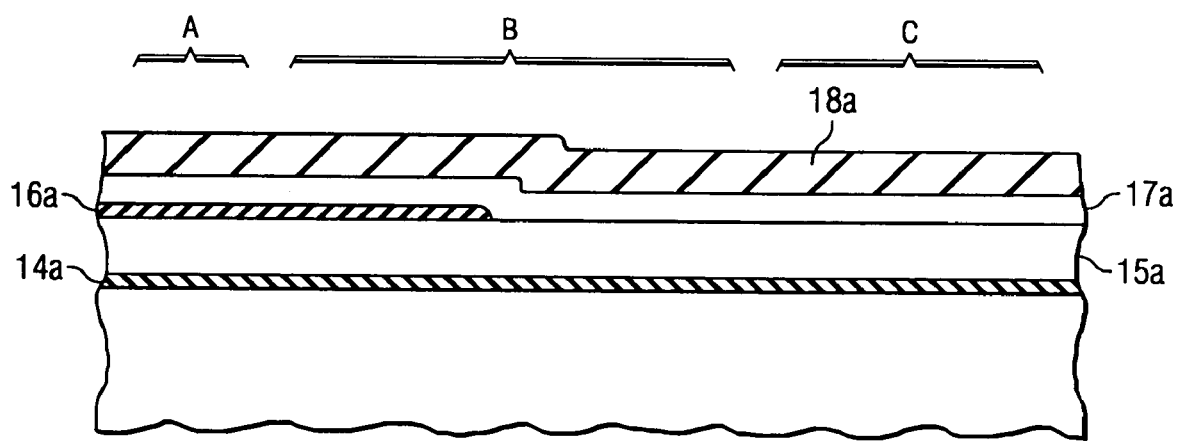
FIGS. 6–9 are enlarged sectional views, drawn to an enlarged scale, of a portion of a semiconductor substrate during fabrication steps according to a second embodiment of the inventive process shows the profile of control signals applied to the cell of FIG. 1.

In FIG. 6, a first dielectric layer 14a, first semiconductor material layer 15a, and second dielectric layer 16a, e.g., silicon oxide, are provided on a semiconductor substrate S which includes a first portion A, second portion B, and third portion C.

The second dielectric layer 16a is removed from the third portion C of the substrate 1 where the RF devices are to be formed, and from a portion of the second portion B adjacent to the third portion C, by a photolithographic operation followed by etching.

Advantageously, the first dielectric layer 14a is an oxide layer with which the gate oxide layer of the CMOS transistors and the drain-extension MOS transistors is formed, and the first layer 15a of semiconductor material is a polysilicon layer by means of which the layer POLY1 of the CMOS transistors and a first portion of the gate region of the drain-extension MOS transistor are formed.

There is then a cascade formation, on the whole device, of a stack structure comprising a second semiconductor material layer 17a, e.g., polysilicon, and a low-resistivity layer 18a, e.g., tungsten.

Figure 7:
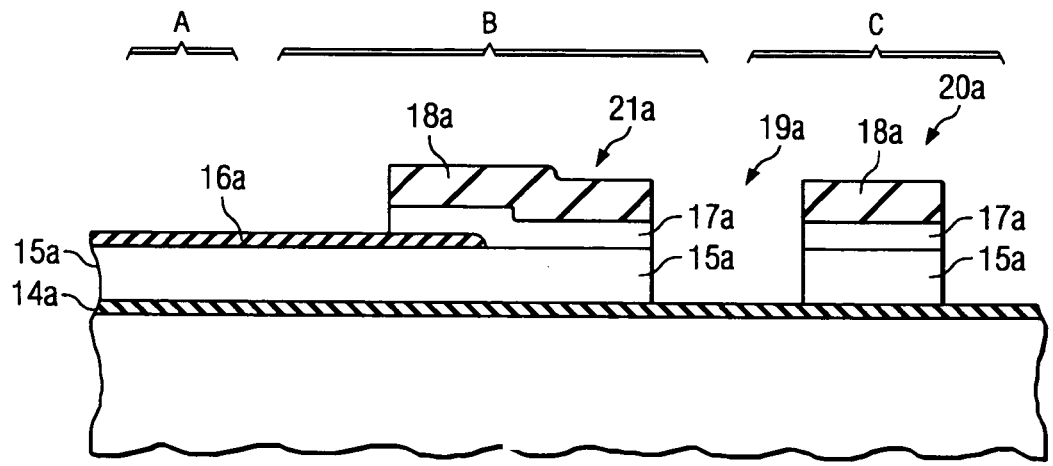

Turning now to FIG. 7, first openings 19a are provided in the portion C, in the first semiconductor material layer 16a, in the second semiconductor material layer 17a, and in the low resistivity layer 18a, to define a gate region 20a for the RF application devices.

The second semiconductor material layer 17a and the low-resistivity layer 18 are fully removed from the substrate portion A where the CMOS devices are to be formed.

Advantageously, the second dielectric layer 16a formed on the first polysilicon layer 15a is utilized as a screen during removal of the first and second semiconductor material layers 15a and 17a from the portion C of the substrate S to produce the ports 19a.

Thus, a structure 21a is defined in portion B to isolate the substrate portion A where the CMOS devices are to be formed from the substrate portion C where the RF application devices are to be formed.

Figure 8:
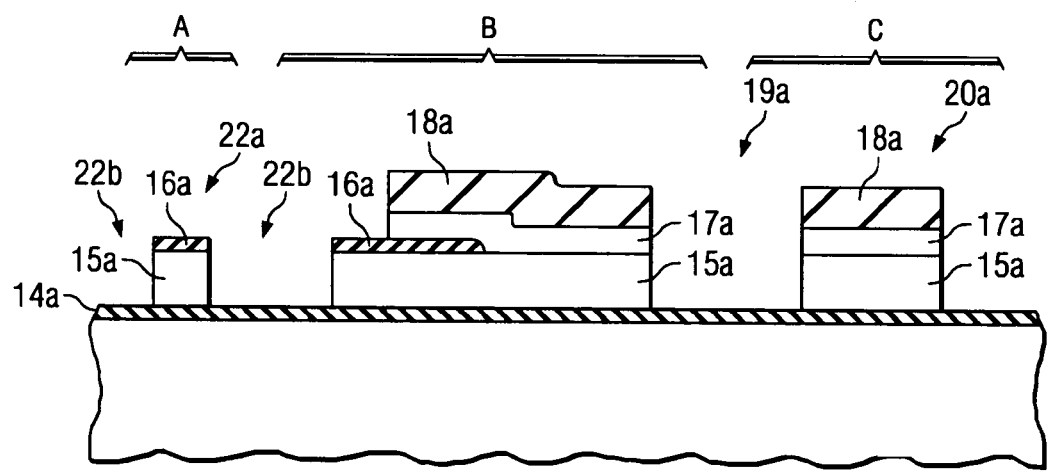

Through a conventional photolithography technique followed by etching, gate regions 22a of the CMOS transistors are defined in the portion A of the substrate 14a using openings 22b, as shown in FIG. 8.

Figure 9:
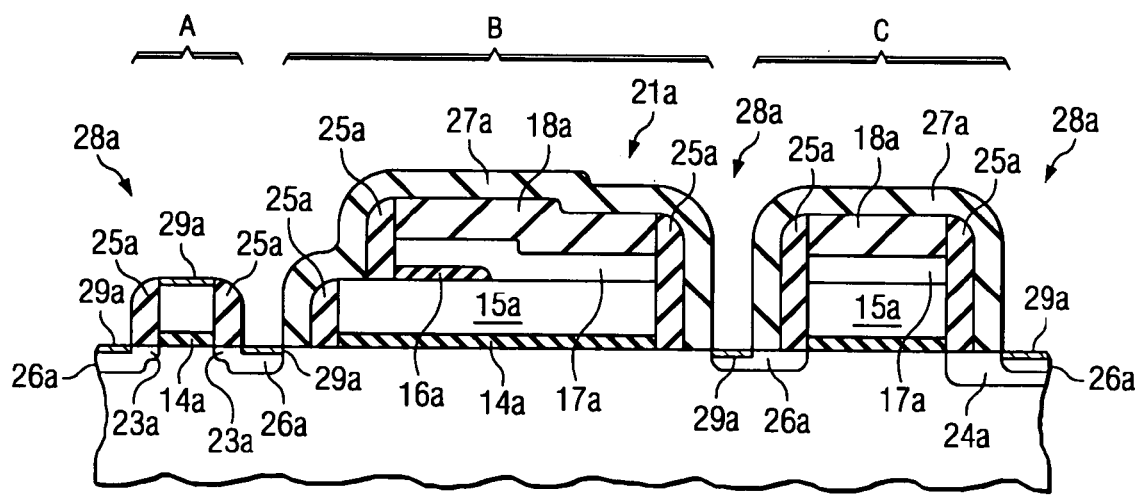

Reference is now made to FIG. 9. In the substrate first LDD implanted regions 23a are then formed so as to provide source and drain regions for the CMOS transistors.

Advantageously, drift regions 24a of the drain-extension MOS transistors are also formed during this process step.

Conventional techniques are then applied to form spacers 25a on the sidewalls of the gate regions 20a of the RF devices, and on those of the division structure 21a and the gate regions 22a of the CMOS transistors.

Thereafter, second heavily doped implanted regions 26a are provided to complete the source and drain regions of the CMOS transistors, and to complete the body and drain regions of the drain-extension MOS transistors.

A protective layer 27a is then deposited onto the whole device. This protective layer 27a is removed from the substrate portion A completely to expose the substrate S. The protective layer 27a is provided with openings 28a at the body and drain regions of the drain-extension MOS transistor.

A metal layer is formed on the whole device. The device is then subjected to a thermal process so that the metal layer reacts with the uncovered substrate by the protective layer 27a and forms a silicide layer 29a.

To summarize, the method of the invention allows high-density high-performance CMOS structures to be integrated on a common substrate along with high- performance drain-extension MOS structures, without introducing any dedicated process steps to make either structures.

In particular, the gate region 20 of the drain-extension MOS transistor is provided with a low-resistance layer 18 by depositing the low-resistance layer 18 onto the polysilicon layer 17, while the heavily doped regions 26 of the CMOS transistors and the drain-extension MOS transistors are silicided in a self-aligned silicidation process that will also silicide the gate regions 22 of the CMOS transistors.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for forming, on a common semiconductor substrate, CMOS transistors and drain-extension MOS transistors on at least first and second portions, respectively, of the substrate, the process comprising the following steps:
   in said first portion, forming at least one CMOS transistor having a first gate region projecting from the substrate, and having respective source and drain regions formed in the substrate, each one including a first, lightly doped portion adjacent to the gate region, and including a second, heavily doped portion within said first lightly doped portion; and
   in said second portion, forming at least one drain-extension MOS transistor having a gate region projecting from the substrate, a source region including a first, heavily doped portion aligned to said gate region, and a drain region formed in the substrate and including a first, lightly doped portion adjacent to the gate region, and a second, heavily doped portion within said first lightly doped portion,
   the process comprising:
   forming a low-resistance layer on said gate region of the drain-extension MOS transistor;
   forming a protective layer on said gate region and said first lightly doped portion of the drain-extension MOS transistor;
   forming a metal layer over said second heavily doped portions of said CMOS transistor and said drain-extension MOS transistor, and on said gate region of said CMOS transistor; and
   operating a thermal treatment so as make said metal layer react with the substrate and the gate region of said CMOS transistor, and form a silicide layer.

2. The process according to claim 1, wherein said CMOS transistor and said drain-extension MOS transistor are formed by:
   forming a first dielectric layer on the whole substrate;
   forming a first semiconductor material layer on said first dielectric layer in said at least one first portion;
   forming, over the whole substrate, a stack structure comprising a second dielectric layer, second semiconductor layer, and low-resistance layer;
   defining first openings in said second semiconductor layer and said low-resistance layer to provide said gate regions of the drain-extension MOS transistors;
   completely removing said second semiconductor layer and said low-resistance layer from said first portion of the substrate by using said second dielectric layer as a screen; and
   defining second openings in said second dielectric layer and in said second semiconductor layer to provide said gate regions of the CMOS transistors.

3. The process according to claim 2, wherein said dielectric layers are silicon oxide layers.

4. The process according to claim 2, wherein said semiconductor layers are polysilicon layers.

5. The process according to claim 1, wherein said CMOS transistor and said drain-extension MOS transistor are formed by:
   forming, on the whole substrate, a stack structure comprising a first dielectric layer, and a first semiconductor material layer;
   forming a second dielectric layer in said at least one first portion;
   forming, on the whole substrate, a stack structure comprising a second semiconductor layer and a first low-resistance layer;
   defining first openings in said first low-resistance layer, said second semiconductor layer, and said first semiconductor material layer to provide said gate regions of the vertical or lateral MOS transistors;
   completely removing said second semiconductor layer and said first low-resistance layer from said first portion of the substrate by using said second dielectric layer as a screen; and
   defining second openings in said second dielectric layer and said second semiconductor layer to provide said gate regions of the CMOS transistors.

6. The process according to claim 5, wherein said dielectric layers are silicon oxide layers.

7. The process according to claim 5, wherein said semiconductor layers are polysilicon layers.

8. The process according to claim 1, wherein forming said low-resistance layer is preceded by:
   implanting, in the substrate, said first lightly doped implanted regions adjacent to said gate regions of both the CMOS and the vertical or lateral MOS transistors;
   defining spacers on the sidewalls of said gate regions; and
   implanting, in the substrate, second heavily doped implanted regions aligned to said spacers.

9. The process according to claim 1, wherein said first low-resistance layer comprises tungsten.

10. The process according to claim 1, wherein said metal layer comprises at least one transition metal.

11. The process according to claim 1, wherein the substrate has a third portion extending between said first portion and said second portion, and including forming a division structure between said first portion and said second portion.

12. A process for forming, on a common semiconductor substrate, CMOS transistors and vertical or lateral MOS transistors on at least first and second portions, respectively, of the substrate, the process comprising:
  forming a first dielectric layer on the whole substrate;
  forming a first semiconductor material layer on the first dielectric layer, in the first portion;
  forming, on the whole substrate, a stack structure comprising a second dielectric layer, second semiconductor layer, and low-resistance layer;
  the process being in that it further comprises the steps of:
  defining first ports in the second semiconductor layer and the low-resistance layer to provide gate regions of the vertical or lateral MOS transistors;
  completely removing the second semiconductor layer and the low-resistance layer from the first portion of the substrate by using the second dielectric layer as a screen;
  defining second ports in the second dielectric layer and the second semiconductor layer to provide gate regions with the CMOS transistors;
  screening off the gate region of the vertical or lateral MOS transistors with a protective layer;
  forming a low-resistance layer on the gate regions of the CMOS transistors.

13. A process for forming CMOS and drain extension MOS transistors on a common substrate, comprising:
  forming a gate, drain and source of the CMOS transistor in a first portion of the common substrate;
  forming a gate, drain and source of the drain extension MOS transistor in a second portion of the common substrate, the MOS transistor drain including a heavily implanted region and a gate-adjacent lightly implanted region;
  forming a protective layer overlying the gate and gate-adjacent lightly implanted region of the drain extension MOS transistor, the formed protective layer not overlying at least a portion of the gate, drain and source of the CMOS transistor and not overlying at least a portion of the source and heavily implanted region of the drain extension MOS transistor; and
  siliciding the exposed portions of the gate, drain and source of the CMOS transistor and exposed portions of the source and heavily implanted region of the drain extension MOS transistor.

14. The process of claim 13 further including forming a protective structure when forming the gates of the CMOS transistor and the drain extension MOS transistor, the protective structure separated from the CMOS transistor and the drain extension MOS transistor, and positioned on the substrate in a third portion located between the first and second portions.

15. The process of claim 13 wherein forming the gates of the CMOS transistor and the drain extension MOS transistor comprises:
  forming the gate of the CMOS transistor from a deposited first polysilicon layer; and
  forming the gate of the drain extension MOS transistor from a separately deposited second polysilicon layer.

16. The process of claim 15 wherein forming the gate of the drain extension MOS transistor comprises forming the drain extension MOS transistor gate from the deposited first polysilicon layer and the separately deposited second polysilicon layer.

17. The process of claim 15 further including forming an isolation structure in a second portion of the substrate between the first and second portions to isolate the CMOS transistor from the drain extension MOS transistor.

18. The process of claim 17 wherein forming the isolation structure comprises forming the isolation structure from the deposited first polysilicon layer and the separately deposited second polysilicon layer.

19. The process of claim 18 wherein the first polysilicon layer completely underlies the second polysilicon layer in the isolation structure.

20. The process of claim 18 wherein the first polysilicon layer partially underlies the second polysilicon layer in the isolation structure.

21. The process of claim 18 further including depositing a low resistivity layer over the second polysilicon layer in both the isolation structure and the gate of the MOS transistor.

22. The process of claim 21 wherein forming the protective layer comprises depositing the protective layer overlying both the isolation structure and the gate of the MOS transistor.

23. The process of claim 15 further comprising depositing a low resistivity layer to overlie the second polysilicon layer at the gate of the MOS transistor.

* * * * *